United States Patent
Ji et al.

(10) Patent No.: US 12,215,413 B2
(45) Date of Patent: Feb. 4, 2025

(54) MASK ASSEMBLY AND MANUFACTURING METHOD THEREOF

(71) Applicants: Chengdu BOE Optoelectronics Technology Co., Ltd., Chengdu (CN); BOE Technology Group Co., Ltd., Beijing (CN)

(72) Inventors: Fengli Ji, Beijing (CN); Jinsan Park, Beijing (CN); Yidan Zhu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 609 days.

(21) Appl. No.: 17/418,200

(22) PCT Filed: Dec. 29, 2020

(86) PCT No.: PCT/CN2020/140978
§ 371 (c)(1),
(2) Date: Jun. 24, 2021

(87) PCT Pub. No.: WO2021/136288
PCT Pub. Date: Jul. 8, 2021

(65) Prior Publication Data
US 2023/0138125 A1    May 4, 2023

(30) Foreign Application Priority Data
Jan. 3, 2020    (CN) .......................... 202010006103.4

(51) Int. Cl.
C23C 14/24    (2006.01)
C23C 14/04    (2006.01)

(52) U.S. Cl.
CPC ............ *C23C 14/042* (2013.01); *C23C 14/24* (2013.01)

(58) Field of Classification Search
None
See application file for complete search history.

(56) References Cited

U.S. PATENT DOCUMENTS

| | | |
|---|---|---|
| 2012/0329188 A1 | 12/2012 | Sonoda et al. |
| 2014/0130735 A1 | 5/2014 | Kim |
| 2019/0010599 A1* | 1/2019 | Lin ........................ C23C 14/24 |
| 2019/0144987 A1* | 5/2019 | Guo ........................ C23C 14/24 |
| | | 118/504 |
| 2020/0181754 A1* | 6/2020 | Ye ........................ C23C 14/042 |

(Continued)

FOREIGN PATENT DOCUMENTS

| | | |
|---|---|---|
| CN | 105039907 A | 11/2015 |
| CN | 205893376 U | 1/2017 |

(Continued)

OTHER PUBLICATIONS

English translation of KR101659948B1.*
CN202010006103.4 first office action.

*Primary Examiner* — Charles Capozzi
(74) *Attorney, Agent, or Firm* — IPro, PLLC

(57) ABSTRACT

Provided by the present disclosure are a mask assembly and a manufacturing method thereof. In the mask assembly, a plurality of connecting posts are arranged at intervals on an outer periphery of a body of a metal plate, and a plurality of grooves matched with the connecting posts are arranged on a metal frame.

16 Claims, 6 Drawing Sheets

(56) References Cited

U.S. PATENT DOCUMENTS

2021/0108304 A1     4/2021  Kim
2021/0207257 A1 *   7/2021  Jin ......................... C23C 14/24

FOREIGN PATENT DOCUMENTS

| CN | 206279261 U | | 6/2017 | | |
|---|---|---|---|---|---|
| CN | 107699854 A | * | 2/2018 | ........... | C23C 14/042 |
| CN | 207159336 U | | 3/2018 | | |
| CN | 107904553 A | | 4/2018 | | |
| CN | 110343999 A | | 10/2019 | | |
| CN | 209702837 U | | 11/2019 | | |
| CN | 110551972 A | | 12/2019 | | |
| CN | 111041416 A | | 4/2020 | | |
| KR | 101659948 B1 | * | 10/2016 | ........... | C23C 14/042 |
| WO | WO-2018103322 A1 | * | 6/2018 | ........... | B05C 21/005 |
| WO | WO-2018196365 A1 | * | 11/2018 | ............. | C23C 14/04 |

\* cited by examiner

MASK ASSEMBLY AND MANUFACTURING METHOD THEREOF

CROSS-REFERENCE TO RELATED APPLICATIONS

The present application claims the priority to a Chinese patent application No. 202010006103.4, filed to the Patent Office of the People's Republic of China on Jan. 3, 2020 and entitled "Mask Assembly and Manufacturing Method Thereof", the entire contents of which are incorporated herein by reference.

FIELD

The present disclosure relates to the field of display device processing, in particular to a mask assembly and a manufacturing method thereof.

BACKGROUND

In the related art, as the display device screens, e.g. mobile phone screens become diversified, the display screen is not a traditional rectangle any more, but develops into many shapes, e.g. an active area (AA) with four rounded corners, and a top frame with a chamfered area, which poses a great challenge to the traditional linear support and overlay structure plus fine metal mask (FMM). The FMM openings of pixels in the AA of traditional rectangular screen are also arranged in a traditional straight line; while the FMM openings of pixels in the AA of a screen with a rounded or a chamfered area is also special-shaped, which will inevitably affect the stress distribution of FMM if an opening may not be designed on the FMM at a position where a material may not be evaporated. The traditional overlay structure and support structure are linear and may not block the evaporation of a material at a chamfer, if an opening is designed on the FMM at a position where a material may not be evaporated.

SUMMARY

An embodiment of the present disclosure provides a mask assembly, including:

a metal frame, wherein the metal frame is provided with a first operation window penetrating through a thickness direction of the metal frame;

a metal plate, wherein the metal plate and the metal frame are stacked, the metal plate includes a body and a plurality of connecting posts, the body is located in the first operation window and is provided with a plurality of second operation windows penetrating through a thickness direction of the body, the plurality of connecting posts are arranged at intervals along an outer periphery of the body, the metal frame is provided with a plurality of grooves matched with the plurality of connecting posts, the plurality of grooves correspond to the plurality of connecting posts one by one and communicate with the first operation window, and the plurality of connecting posts are located in the grooves and welded to the metal frame; and at least one FMM, wherein the at least one FMM is located on one side, away from the metal frame, of the metal plate; and the at least one FMM is provided with a plurality of openings penetrating through a thickness direction of the at least one FMM, and is welded to the metal frame.

In a possible implementation, according to the mask assembly provided by the embodiment of the present disclosure, the at least one FMM is welded to an area, located between two adjacent connecting posts, of the metal frame.

In a possible implementation, according to the mask assembly provided by the embodiment of the present disclosure, the at least one FMM includes a support connecting part and an opening part, the support connecting part is at least located at two ends of the opening part and is welded to the metal frame, and the plurality of openings are arranged in the opening part.

In a possible implementation, according to the mask assembly provided by the embodiment of the present disclosure, an outer contour of the body is the same as that of the first operation window, and an outer peripheral wall of the body is attached to an inner peripheral wall of the first operation window.

In a possible implementation, according to the mask assembly provided by the embodiment of the present disclosure, the plurality of second operation windows are arranged at intervals; and there are a plurality of FMMs, and each of the FMMs blocks at least one of the second operation windows.

In a possible implementation, according to the mask assembly provided by the embodiment of the present disclosure, the plurality of second operation windows are arranged in multiple rows and multiple columns, the plurality of FMMs correspond to multiple columns of the second operation windows one by one, each of the FMMs blocks the second operation windows in one column of the second operation windows, and two ends of the each FMM in a length direction are welded to the metal frame.

In a possible implementation, according to the mask assembly provided by the embodiment of the present disclosure, two connecting posts extending in a column extension direction of the second operation windows are arranged between two adjacent columns of second operation windows; and the two connecting posts are respectively located at two ends, along the column extension direction, of the second operation windows; and two connecting posts extending in the column extension direction of the second operation windows are arranged at two ends, along the row extension direction, of the second operation windows; and the two connecting posts are respectively located at two ends, along the column extension direction, of the second operation windows.

In a possible implementation, according to the mask assembly provided by the embodiment of the present disclosure, two connecting posts extending in a row extension direction of the second operation windows are arranged between two adjacent rows of the second operation windows; and the two connecting posts are respectively located at two ends, along the row extension direction, of the second operation windows; and two connecting posts extending in the row extension direction of the second operation windows are arranged at two ends, along the column extension direction, of the second operation windows; and the two connecting posts are respectively located at two ends, along the row extension direction, of the second operation windows.

In a possible implementation, according to the mask assembly provided by the embodiment of the present disclosure, a depth of each of the grooves is H, and a thickness of each of the connecting posts is h, and H and h satisfy the condition of H≥h.

In a possible implementation, according to the mask assembly provided by the embodiment of the present disclosure, H and h satisfy the condition of H−h≥10 μm.

In a possible implementation, according to the mask assembly provided by the embodiment of the present disclosure, a shape of the second operation window is a rectangle with a rounded or chamfered area.

In another aspect, an embodiment of the present disclosure also provides a manufacturing method of the mask assembly, wherein the method includes:

manufacturing the metal frame provided with the first operation window and the plurality of grooves;

manufacturing the metal plate including the body and the plurality of connecting posts;

where the body is provided with the plurality of second operation windows;

manufacturing the at least one FMM provided with the plurality of openings;

stacking the at least one FMM and the metal plate on the metal frame, where the at least one FMM is located on one side, away from the metal frame, of the metal plate; and welding the plurality of connecting posts of the metal plate in the grooves, and welding the at least one FMM to the metal frame.

DETAILED DESCRIPTION OF THE EMBODIMENTS

Figure 1:
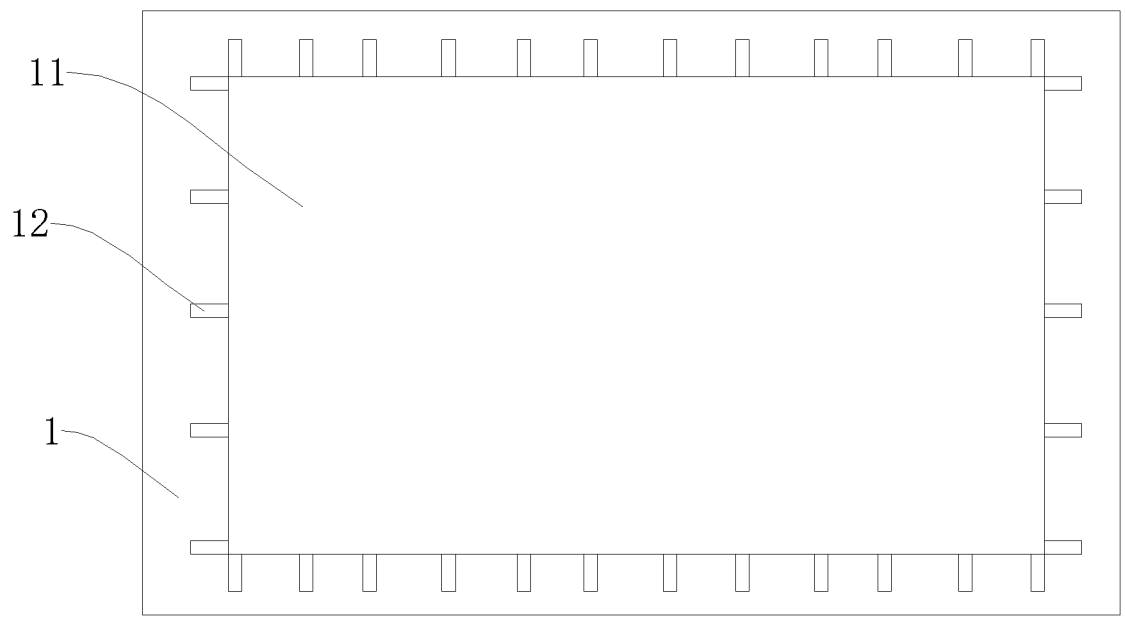
FIG. 1 is a front view of a metal frame of a mask assembly provided by the embodiment of the present disclosure.

Embodiments of the present disclosure are described in detail below, and examples of the embodiments are shown in the accompanying drawings, wherein the same or similar designations from beginning to end indicate the same or similar elements or elements having the same or similar functions. The embodiments described below by reference to the accompanying drawings are exemplary, which are intended only to explain the present disclosure and are not to be construed as limiting the present disclosure.

In the description of the present disclosure, it should be understood that the orientation or positional relationship indicated by the terms "length", "width", "thickness", "upper", "lower", "inner", "outer", "circumferential" and the like is based on the orientation or positional relationship shown in the drawings, and is only for the convenience of describing the present disclosure and simplifying the description, and does not indicate or imply that the device or element referred to must have a specific orientation or are structured and operated in the specific orientation. In the description of the present disclosure, "a plurality of" means two or more, unless otherwise specified.

In the description of the present disclosure, it should be noted, unless otherwise explicitly specified and defined, the terms "installation" and "connection" are to be understood in a broad sense, for example, a fixed connection, a removable connection, or an integral connection; a mechanical connection or an electrical connection; a direct connection, or a connection through an intermediate medium, and a communication within two elements. For a person of ordinary skill in the art, the specific meaning of the above terms in the context of the present disclosure may be understood in specific cases.

Below is the description of the mask assembly 100 according to an embodiment of the present disclosure and with reference to FIGS. 1-5.

As shown in FIGS. 1-5, a mask assembly 100 according to embodiments of the present disclosure includes a metal frame 1, a metal plate 2 and at least one FMM 3.

Figure 2:
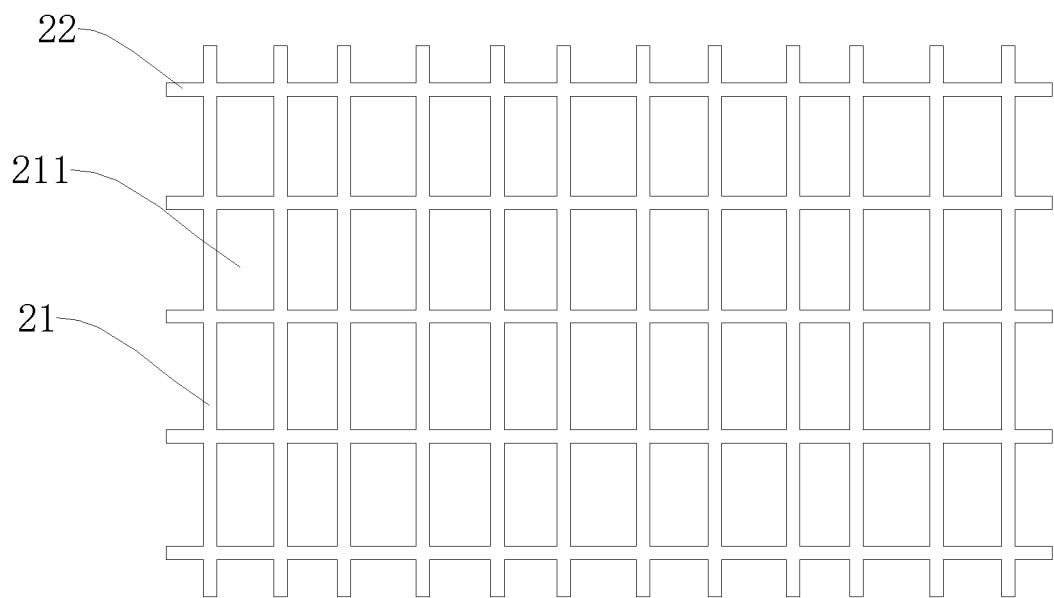
FIG. 2 is a front view of a metal plate of a mask assembly provided by the embodiment of the present disclosure.
Figure 3:
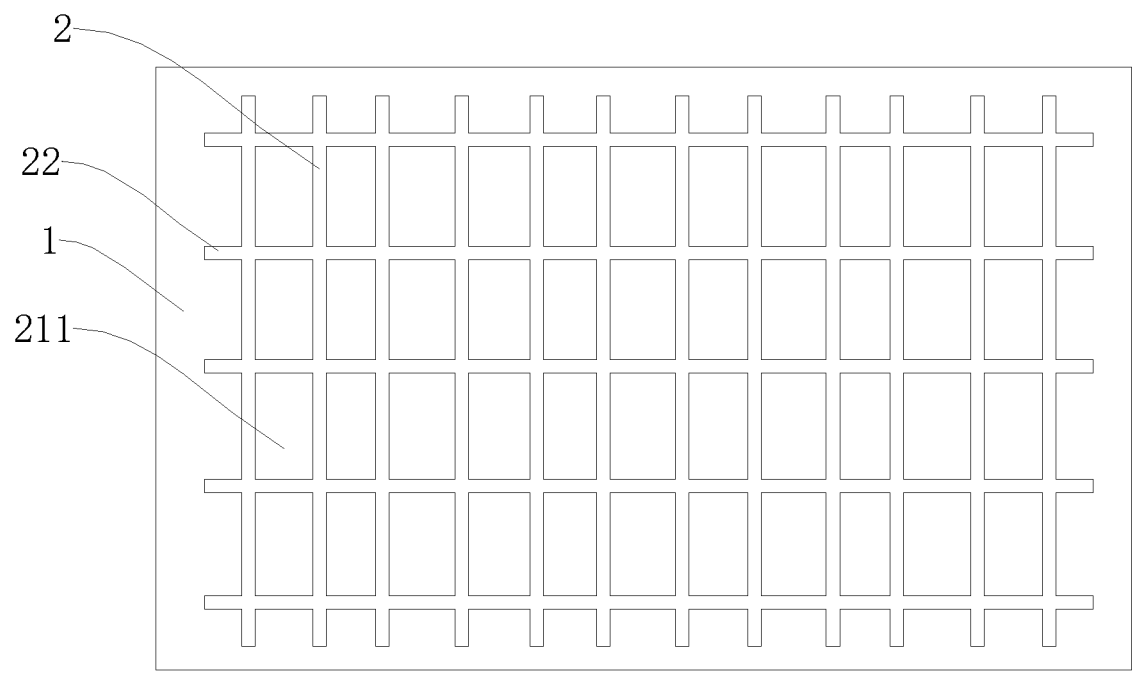
FIG. 3 is an assembly front view of a metal frame and a metal plate of a mask assembly provided by the embodiment of the present disclosure.

Specifically, as shown in FIGS. 1-3, the metal frame 1 is provided with a first operation window 11 penetrating through a thickness direction of the metal frame 1, and may allow a material to be evaporated to pass through.

The metal plate 2 is laminated with the metal frame 1, and the metal plate 2 includes a body 21 that is arranged opposite to the first operation window 11 and located in the first operation window 11. Thus, an overlapping area between the body 21 and the metal frame 1 may be avoided, and the situation of a residue of chemical between the metal frame 1 and the body 21 may be improved.

The body 21 is provided with a plurality of second operation windows 211 penetrating through a thickness direction of the body, and the plurality of second operation windows 211 are located in the first operation window 11. The plurality of second operation windows 211 may allow a material to be evaporated to pass through, and match the shapes and sizes of display areas of display panels to be evaporated. The plurality of second operation windows 211 of the metal plate 2 allow evaporating a material to be evaporated in a display area of each display panel, and the body 21 covers the areas outside the display areas to avoid evaporating a material at a position where the material should not be evaporated.

As shown in FIG. 1 and FIG. 2, the plurality of connecting posts 22 are arranged at intervals on the outer periphery of the body 21 and along the circumferential direction of the body 21. The metal frame 1 may be provided with a plurality of grooves 12 matched with the connecting post 22, and the grooves 12 are communicated with the first operation window 11, do not penetrate through a thickness direction of the metal frame 1, and correspond to the plurality of connecting posts 22 one by one. The connecting posts 22 are located in the grooves 12 and welded to the metal frame 1, so that at least part of the connecting posts 22 may sink into the grooves 12.

Figure 4:
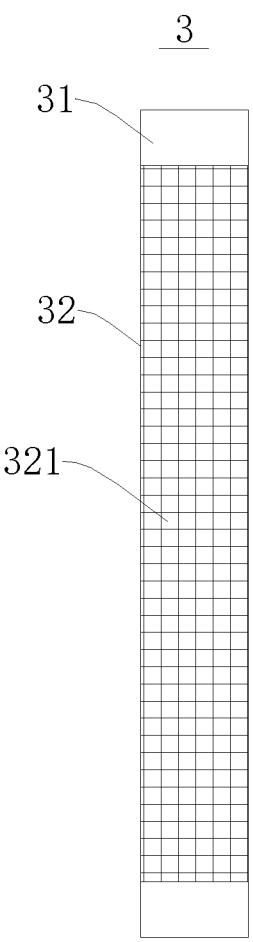
FIG. 4 is a front view of a FMM of a mask assembly provided by the embodiment of the present disclosure.
Figure 5:
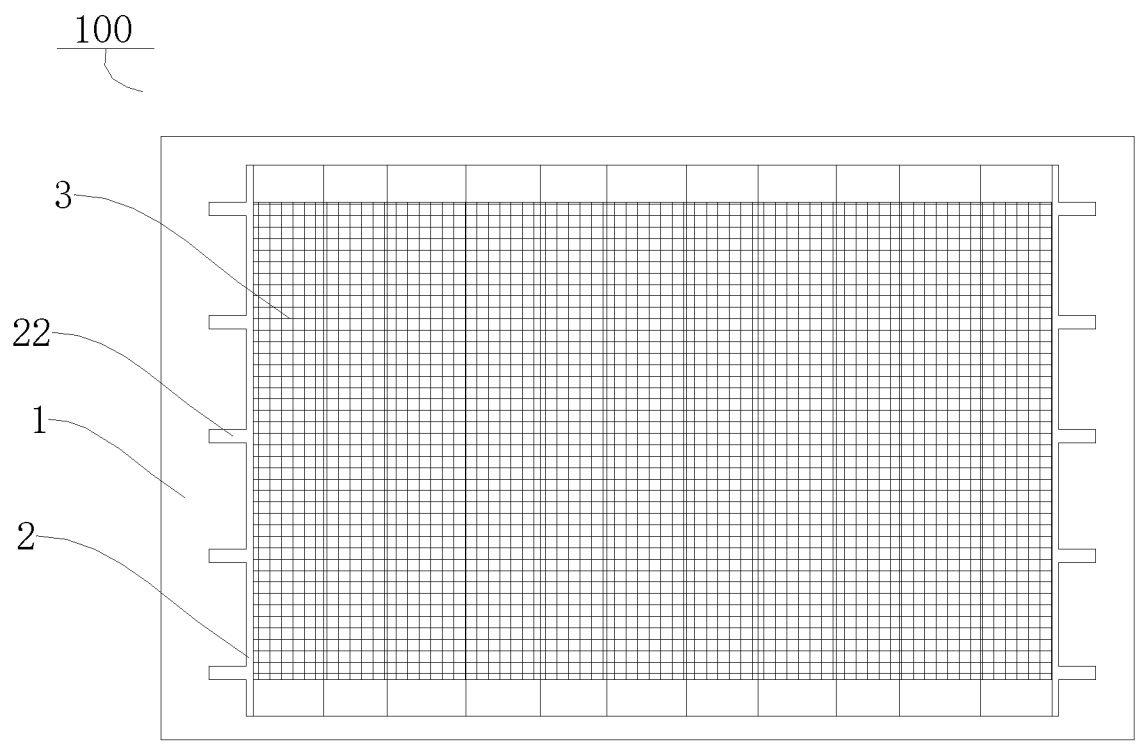
FIG. 5 is a front view of a mask assembly provided by the embodiment of the present disclosure.
Figure 6A:
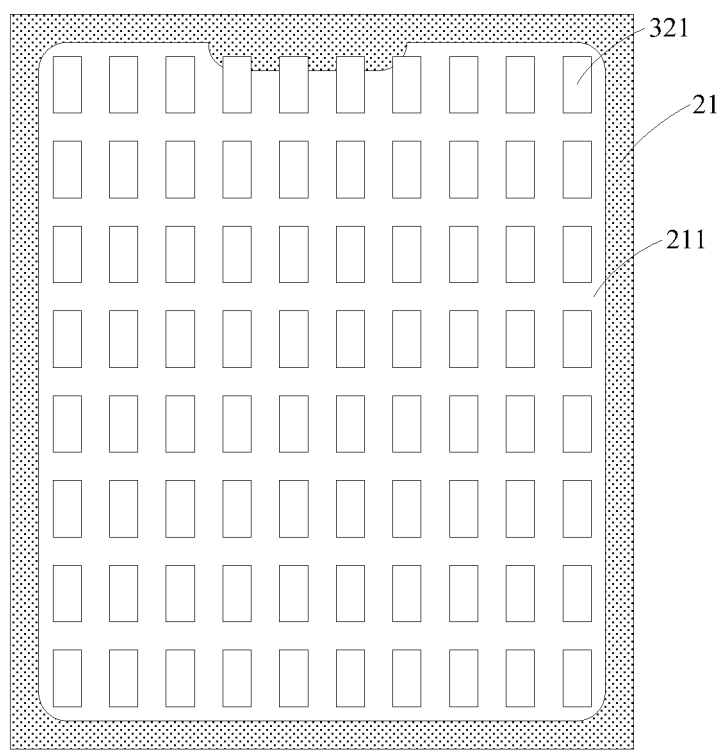
FIGS. 6A to 6E are respective front views of a second operation window after assembling a metal plate of a mask assembly and a FMM provided by the embodiment of the present disclosure.
Figure 6B:
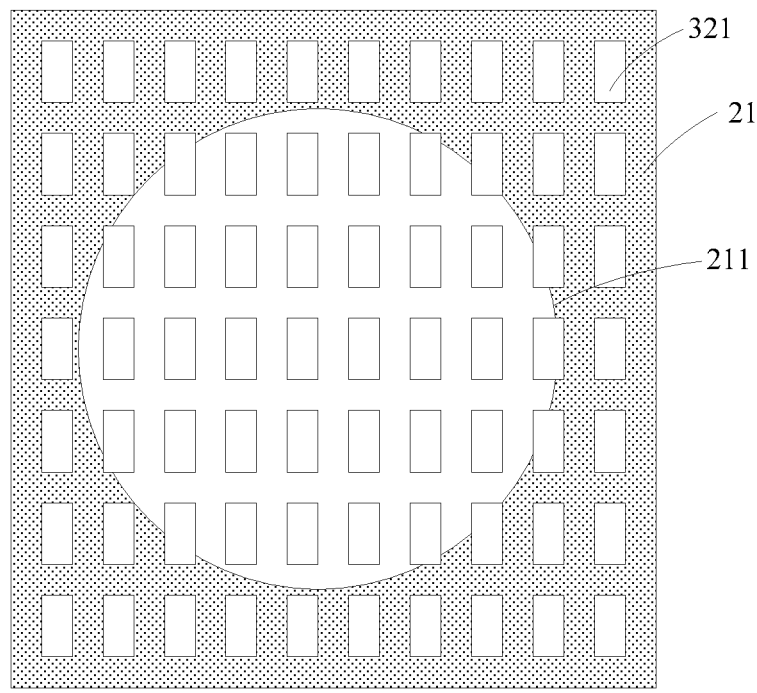
Figure 6C:
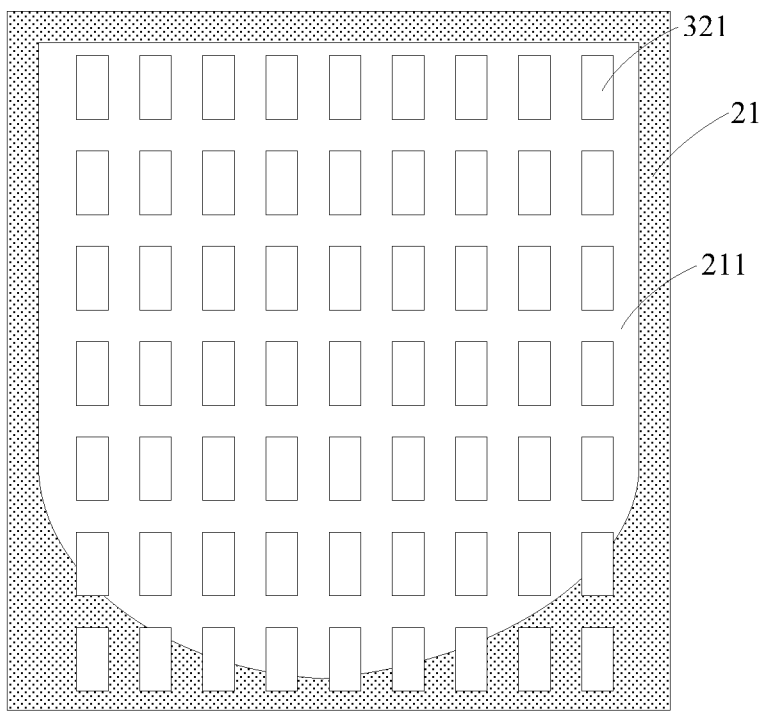
Figure 6D:
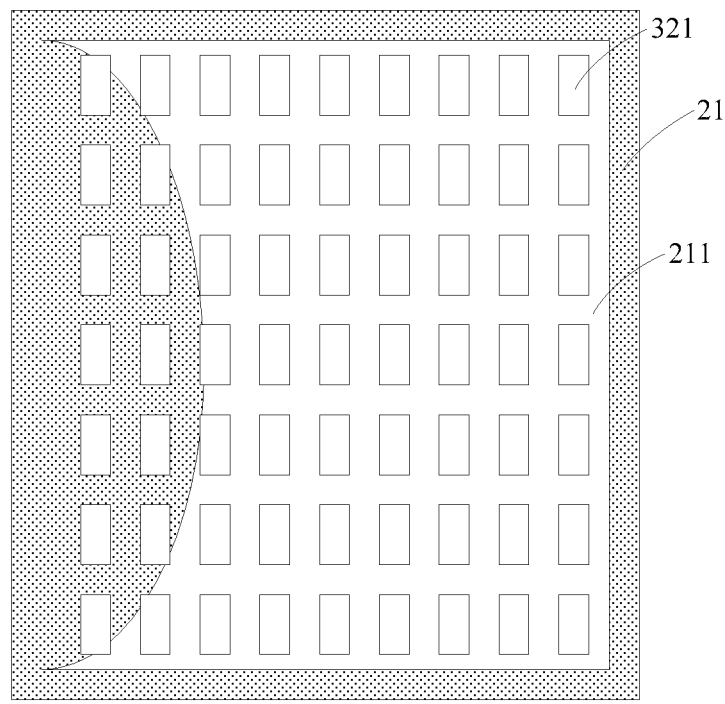
Figure 6E:
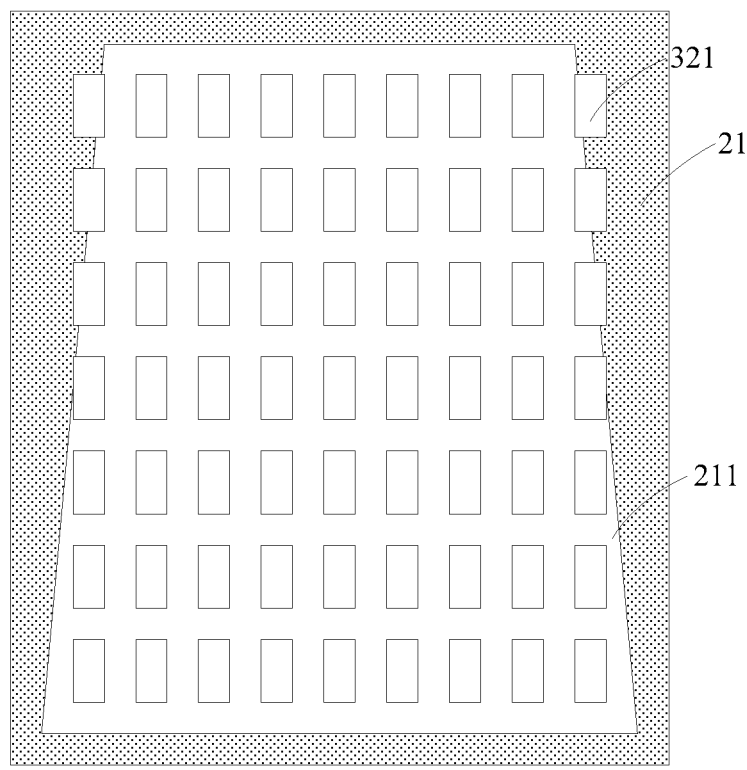

As shown in FIG. 4 and FIG. 5, the FMM 3 is laminated with the metal plate 2 and located on one side, away from the metal frame 1, of the metal plate 2; the FMM 3 is provided with a plurality of openings 321 penetrating through a thickness direction of the FMM, the openings 321 may allow a material to be evaporated to pass through, and at least part of the openings 321 may match the shapes and sizes of light emitting areas in display areas of the evaporated display panels. The opening 321 of the FMM 3 allows evaporating a material to be evaporated in the light emitting area in the display area of each display panel, and other parts of the FMM 3 cover the areas outside the light emitting areas to avoid evaporating a material at a position where the material should not be evaporated.

The FMM 3 may be directly welded to the metal frame 1 to enhance the fixing reliability of the FMM 3 and improve the problem of wrinkling of the FMM 3.

Specifically, according to the mask assembly 100 provided by the embodiment of the present disclosure, a plurality of connecting posts 11 are arranged at intervals on the outer periphery of the body 21 of the metal plate 2, and a plurality of grooves 12 matched with the connecting posts 22 are arranged on the metal frame 1. By this way, the connecting posts 22 may sink into the grooves 12 to reduce the distance between the FMM 3 and the metal frame 1, facilitate the welding of the FMM 3 to the metal frame 1, enhance the fixing reliability of the FMM 3 and improve the problem of wrinkling of the FMM 3. In addition, the FMM 3 is welded to the metal frame 1, so as to avoid an overlapping area between the FMM 3 and the metal plate 2 in the area where the metal frame 1 is located, and improve the situation of a residue of chemical between the metal plate 2 and the FMM 3.

In addition, during the evaporation process of the mask assembly 100, the metal plate 2 may fluctuate up and down. The FMM 3 is welded to the metal frame 1 rather than the metal plate 2, so as to improve the problem of wrinkling of the FMM 3 caused by the fluctuation of the metal plate 2, and enhance the working reliability of the mask assembly 100.

Optionally, according to the mask assembly 100 provided by the embodiment of the present disclosure, the FMM 3 may be welded to an area, located between two adjacent connecting posts 22, of the metal frame 1.

Specifically, during the evaporation process of the mask assembly 100, the metal plate 2 may fluctuate up and down. The FMM 3 is welded to an area, located between two adjacent connecting posts 22, of the metal frame 1 rather than welded to the metal plate 2, so as to improve the problem of wrinkling of the FMM 3 caused by the fluctuation of the metal plate 2, enhance the working reliability of the mask assembly 100, and avoid the problem that a residue of chemical in a welding area between the FMM 3 and the metal plate 2 cannot be removed.

Optionally, according to the mask assembly 100 provided by the embodiment of the present disclosure, as shown in FIG. 4, the FMM 3 may specifically include a support connecting part 31 and an opening part 32, the opening part 32 is internally provided with a plurality of openings 321 and used for blocking the second operation windows 211, the support connecting part 31 is used for supporting the opening part 32 to improve the strength of the FMM 3, and the support connecting part 31 may be connected to the metal frame 1. Specifically, the support connecting part 31 may be arranged at two ends of the opening part 32 along the length direction, and may also be arranged around the opening part 32. A size of each opening 321 is smaller than that of a second operation window 211, and the opening 321 allows a material to be evaporated to pass through. The evaporated material may be evaporated to a corresponding position of each display panel through the opening 321 on the FMM 3.

For example, in the mobile phone and flat panel display technologies, active matrix organic light emitting diode (AMOLED) will gradually become the mainstream of the next generation display due to the advantages of self-illumination, bright colors, low power consumption and wide viewing angle. The self-illumination principle of AMOLED is as follows: taking an indium tin oxide (ITO) electrode and a metal electrode made on the back plate as an anode and a cathode of a device, organic semiconductor materials and luminescent materials are evaporated on a substrate. Driven by a certain voltage, electrons and holes are injected into electron and hole transport layers from the cathode and the anode respectively, and then migrate to a luminescent layer through the electron and hole transport layers respectively and meet in the luminescent layer, forming excitons and exciting luminescent molecules that emit visible light after radiation relaxation.

AMOLED may be evaporated by the above mask assembly 100; that is, an organic semiconductor material and a luminescent material are evaporated to a substrate. In the evaporation process, the organic semiconductor material and the luminescent material are located on one side, facing away from the FMM 3, of the metal frame 1; the substrate is located on one side, facing away from the metal frame 1, of the FMM 3; and the luminescent material and the organic semiconductor material may be evaporated to the substrate by sequentially passing through the first operation window 11, the second operation windows 211 and the openings 321 of the FMM 3.

Optionally, according to the mask assembly 100 provided by the embodiment of the present disclosure, in order to meet the requirements for manufacturing display areas with different shapes, the second operation windows 211 may be set into different shapes according to actual needs, which may be specifically a regular shape, as shown in FIGS. 6A to 6E, or an irregular shape, e.g. a rectangle, a circle, an oval, a triangle or a rectangle with a rounded or chamfered area. Based on the requirements for display areas of different shapes, the shapes of the second operation windows 211 in the metal plate 2 need to be changed only for evaporation and blocking, and the FMM 3 may be designed into a universal type to extend the application range of the mask assembly 100 in a display device, which may not only meet the requirements for car rearview mirrors, watches and audio products, but also be combined with virtual reality (VR) and artificial intelligence (AI) technologies to produce more products shown in trapezoid, half circle, concave and other special shapes. Such settings greatly improve the color mixing, and provide stable yield.

Optionally, according to the mask assembly provided by the embodiment of present disclosure, the surface, away from the metal frame 1, of the metal plate 2 may be flush with the area of the surface of the metal frame 1 that faces toward the metal plate 2 and is not provided with the groove 12; alternatively, the surface, away from metal frame 1, of the metal plate 2 may be lower than the area of the surface of the metal frame 1 that faces toward the metal plate 2 and is not provided with the groove 12, so as to facilitate welding connection between the FMM 3 and the metal frame 1.

Specifically, a depth of the groove 12 is set as H and a thickness of the connecting post 22 as h, where H and h satisfy the condition of H≥h. By this way, the connecting posts 22 may all sink into the grooves 12, thus avoiding the problem that the FMM 3 cannot be welded to the metal frame 1 caused by the connecting posts 22 supporting the FMM 3. As a result, the fixing reliability of the FMM 3 is enhanced, and the problem of wrinkling of the FMM 3 is improved.

Further, H and h may satisfy the condition of H−h≥10 μm, to ensure that the connecting posts 22 may all sink into the grooves 12, thus, avoiding the problem that the FMM 3 cannot be welded to the metal frame 1 caused by the connecting posts 22 supporting the FMM 3. As a result, the fixing reliability of the FMM 3 is enhanced, and the problem of wrinkling of the FMM 3 is improved.

Optionally, according to the mask assembly provided by the embodiment of the present disclosure, as shown in FIG. 3, the outer contour of the body 21 may be the same as that of the first operation window 11, and the outer peripheral wall of the body 21 is attached to the inner peripheral wall of the first operation window 11. Therefore, a gap between the outer peripheral wall of the body 21 and the inner peripheral wall of the first operation window 11 may be avoided, the possibility of an evaporated material passing through the gap between the inner peripheral wall of the first operation window 11 and the outer peripheral wall of the body 21 is improved, and the material may not be evaporated at a position where the evaporation is unnecessary.

Optionally, according to some embodiments of the present disclosure, as shown in FIG. 2, the plurality of second operation windows 211 arranged at intervals, and one of the second operation windows 211 corresponds to a display area of one display panel. Therefore, the mask assembly 100 may evaporate a plurality of display panels at the same time, and the working efficiency of the mask assembly 100 is improved. Further, as shown in FIG. 5, there are a plurality of fine metal mask (FMMs) 3, and each of the FMMs 3 blocks at least one of the second operation windows 211. In case a problem occurs in the evaporation process of one or more display panels, only the FMM 3 corresponding to the display panel having an evaporation problem may be disassembled, and not all of the display panels shall be disassembled, thereby simplifying the maintenance process and reducing the cost.

Optionally, as shown in FIG. 2 and FIG. 5, the plurality of second operation windows 211 may be arranged in multiple rows and columns, and the number of second operation windows 211 in one column is smaller than that in one row. The plurality of FMMs 3 may correspond to the plurality of columns of second operation windows 211 one by one, and each of the FMMs 3 blocks the second operation windows 211 in one or more columns of second operation windows 211, so that two ends of the FMMs 3 in the length direction may be welded to the areas, located between two adjacent connecting posts 22, of the metal frame 1. Alternatively, the plurality of FMMs 3 may correspond to the plurality of rows of second operation windows 211 one by one, and each of the FMMs 3 blocks the second operation windows 211 in one or more rows of second operation windows 211. Therefore, in case a problem occurs in the evaporation process of some display panels, only the FMMs 3 corresponding to the display panels having an evaporation problem may be disassembled, and not all of the display panels shall be disassembled, thereby simplifying the maintenance process and reducing the cost at the same time.

Optionally, as shown in FIG. 2, two connecting posts 22 extending in a column extension direction of the second operation windows 211 are arranged between two adjacent columns of second operation windows 211; and the two connecting posts 22 are respectively located at two ends, along the column extension direction, of the second operation windows 211. Two connecting posts 22 extending in a column extension direction of the second operation windows 211 are arranged at two ends, along the row extension direction, of the second operation windows 211; and the two connecting posts 22 are respectively located at two ends, along the column extension direction, of the second operation windows 211. That is, it may be considered that the body 21 of the metal plate 2 includes a first strip-shaped body part extending along the column direction of the second operation windows 211, and the connecting posts 22 may be a part where the first strip-shaped body part extends out of the body at two ends. Therefore, the fixing reliability of the metal plate 2 may be improved, and the phenomenon of distortion of the metal plate 2 may be improved.

Optionally, as shown in FIG. 2, two connecting posts 22 extending along the row extension direction of the second operation windows 211 are arranged between two adjacent rows of the second operation windows 211; and the two connecting posts 22 are respectively located at two ends, along the row extension direction, of the second operation windows 211. Two connecting posts 22 extending along the row extension direction of the second operation windows 211 are arranged at two ends, along the column extension direction, of the second operation windows 211; and the two connecting posts 22 are respectively located at two ends, along the row extension direction, of the second operation windows 211. That is, it may be considered that the body 21 of the metal plate 2 includes a second strip-shaped body part extending along the row direction of the second operation windows 211, and the connecting posts 22 may be a part where the second strip-shaped body part extends out of the body at two ends. Therefore, the fixing reliability of the metal plate 2 may be improved, and the phenomenon of distortion of the metal plate 2 may be improved.

Figure 7:
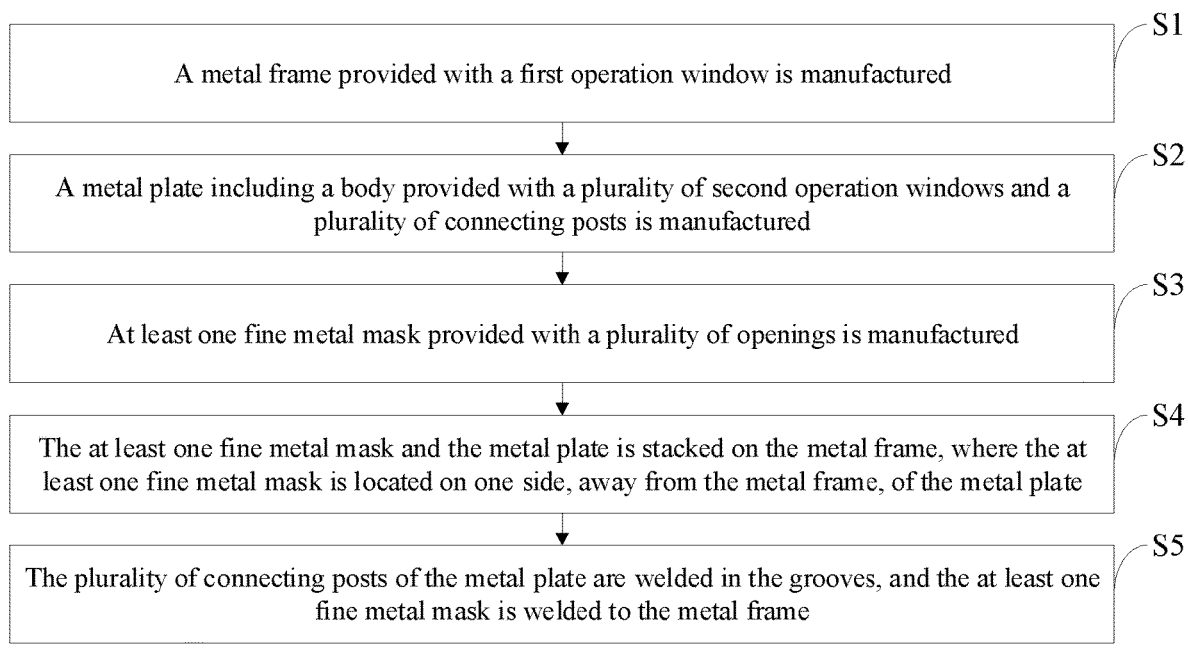
FIG. 7 is a schematic flow chart of a manufacturing method of a mask assembly provided by the embodiment of the present disclosure.

Based on the same inventive concept, embodiments of the present disclosure also provide a manufacturing method of the above mask assembly, and as shown in FIG. 7, the manufacturing method specifically includes the following steps.

S1. A metal frame provided with a first operation window is manufactured.

S2. A metal plate including a body provided with a plurality of second operation windows and a plurality of connecting posts is manufactured.

S3. At least one FMM provided with a plurality of openings is manufactured.

S4. The at least one FMM and the metal plate are stacked on the metal frame; where the at least one FMM is located on one side, away from the metal frame, of the metal plate.

S5. The plurality of connecting posts of the metal plate are welded in the grooves, and the at least one FMM is welded to the metal frame.

Specifically, according to the manufacturing method of the mask assembly provided by the embodiment of the present disclosure, a plurality of connecting posts are arranged at intervals on the outer periphery of the body of the metal plate, and a plurality of grooves matched with the connecting posts are arranged on the metal frame. By this way, the connecting posts may sink into the grooves to reduce the distance between the FMM and the metal frame, facilitate the welding of the FMM to the metal frame, enhance the fixing reliability of the FMM 3 and improve the problem of wrinkling of the FMM 3. In addition, the manufacturing method may avoid the situation that there is a residue of chemical between the FMM and the metal plate when the FMM is welded to the metal plate.

In addition, during the evaporation process of the mask assembly, the metal plate may fluctuate up and down. The FMM is welded to the metal frame rather than the metal plate, so as to improve the problem of wrinkling of the FMM caused by the fluctuation of the metal plate, and enhance the working reliability of the mask assembly.

In the description of the specification, descriptions referring to the terms "one embodiment", "some embodiments", "schematic embodiments", "examples", "specific examples", or "some examples" mean that specific features, structures, materials or characteristics described in connection with the embodiment or example are included in at least one embodiment or example of the present disclosure. In the specification, the schematic expressions of the above terms do not necessarily refer to the same embodiments or examples. Furthermore, the specific features, structures, materials or characteristics described may be combined in any one or more embodiments or examples in a suitable manner.

The embodiments of the present disclosure are shown and described above. For a person of ordinary skill in the art, it should be understood that various changes, modifications, substitutions and variations may be made to these embodiments without departing from the principles and spirit of the present disclosure; and the scope of the present invention is defined by the claims appended thereto and the equivalents thereof.

What is claimed is:

1. A mask assembly, comprising:
   a metal frame, wherein the metal frame is provided with a first operation window penetrating through a thickness direction of the metal frame;
   a metal plate, wherein the metal plate and the metal frame are stacked, the metal plate comprises a body and a plurality of connecting posts, the body of the metal plate is arranged in the first operation window and is provided with a plurality of second operation windows penetrating through a thickness direction of the body of the metal plate, the plurality of connecting posts are arranged at intervals along an outer periphery of the body of the metal plate, a part of the metal frame is provided with a plurality of grooves matched with the plurality of connecting posts, the plurality of grooves correspond to the plurality of connecting posts one by one and communicate with the first operation window, and the connecting posts are arranged in the grooves and are welded to the metal frame; and
   at least one fine metal mask (FMM), wherein the at least one FMM is arranged on one side, away from the metal frame, of the metal plate; and the at least one FMM is provided with a plurality of openings penetrating through a thickness direction of the at least one FMM, and is welded to the metal frame;
   wherein the at least one FMM is only welded to an area, arranged between two adjacent connecting posts, of the metal frame;
   wherein the plurality of connecting posts do not support the at least one FMM;
   wherein a depth of each of the grooves is H, a thickness of each of the connecting posts is h, and H and h satisfy a condition of H−h>10 μm.

2. The mask assembly according to claim 1, wherein the at least one FMM comprises a support connecting part and an opening part;
   the support connecting part is at least arranged at two ends of the opening part and is welded to the metal frame; and
   the plurality of openings are arranged in the opening part.

3. The mask assembly according to claim 1, wherein an outer contour of the body of the metal plate and an outer contour of the first operation window are identical; and
   an outer peripheral wall of the body of the metal plate is attached to an inner peripheral wall of the first operation window.

4. The mask assembly according to claim 1, wherein the plurality of second operation windows are arranged at intervals; and there are a plurality of fine metal masks (FMMs), and each of the plurality of FMMs blocks at least one of the second operation windows.

5. The mask assembly according to claim 4, wherein the plurality of second operation windows are arranged in multiple rows and multiple columns,
   the plurality of FMMs correspond to multiple columns of second operation windows one by one,
   each of the FMMs blocks the second operation windows in one column of second operation windows, and
   two ends of the each FMM in a length direction are welded to the metal frame.

6. The mask assembly according to claim 5, wherein two connecting posts extending in a column extension direction of the second operation windows are arranged between two adjacent columns of second operation windows; and the two connecting posts are respectively arranged at two ends, along the column extension direction, of the second operation windows; and
   two connecting posts extending in the column extension direction of the second operation windows are arranged at two ends, along a row extension direction, of the second operation windows; and the two connecting posts are respectively arranged at two ends, along the column extension direction, of the second operation windows.

7. The mask assembly according to claim 5, wherein two connecting posts extending in a row extension direction of the second operation windows are arranged between two adjacent rows of second operation windows; and the two connecting posts are respectively arranged at two ends, along the row extension direction, of the second operation windows; and
   two connecting posts extending in the row extension direction of the second operation windows are arranged at two ends, along the column extension direction, of the second operation windows; and the two connecting posts are respectively arranged at two ends, along the row extension direction, of the second operation windows.

8. The mask assembly according to claim 1, wherein a shape of a second operation window is a rectangle with a rounded or chamfered area.

9. A manufacturing method of the mask assembly according to claim 1, comprising:
   manufacturing the metal frame provided with the first operation window and the plurality of grooves;
   manufacturing the metal plate comprising the body and the plurality of connecting posts; wherein the body of the metal plate is provided with the plurality of second operation windows;
   manufacturing the at least one FMM provided with the plurality of openings;
   stacking the at least one FMM and the metal plate on the metal frame, wherein the at least one FMM is arranged on one side, away from the metal frame, of the metal plate; and
   welding the plurality of connecting posts of the metal plate in the grooves, and welding the at least one FMM to the metal frame.

10. The mask assembly according to claim 1, wherein one of the plurality of second operation windows corresponds to a display area of one display panel.

11. The mask assembly according to claim 10, wherein each of the plurality of second operation windows matches a shape and size of a display area of a corresponding display panel.

12. The mask assembly according to claim 1, wherein the plurality of grooves do not penetrate through the thickness direction of the metal frame.

13. The mask assembly according to claim 1, wherein at least part of the plurality of openings matches shapes and sizes of light emitting areas in display areas of evaporated display panels.

14. The mask assembly according to claim 1, wherein a size of each opening is smaller than that of a second operation window.

15. The mask assembly according to claim 1, wherein a surface, away from metal frame, of the metal plate is lower than a surface of other parts of the metal frame that faces toward the metal plate, wherein the other parts of the metal frame are not provided with the plurality of grooves.

16. The mask assembly according to claim 4, wherein the plurality of second operation windows are arranged in multiple rows and multiple columns, the plurality of FMMs correspond to multiple rows of second operation windows one by one, and each of the FMMs blocks the second operation windows in one row of second operation windows.

\* \* \* \* \*